United States Patent [19]

Higdon et al.

[11] Patent Number: 5,547,740

[45] Date of Patent: Aug. 20, 1996

[54] SOLDERABLE CONTACTS FOR FLIP CHIP INTEGRATED CIRCUIT DEVICES

[75] Inventors: William D. Higdon, Greentown; Susan A. Mack; Ralph E. Cornell, both of Kokomo all of Ind.

[73] Assignee: Delco Electronics Corporation, Kokomo, Ind.

[21] Appl. No.: 408,792

[22] Filed: Mar. 23, 1995

[51] Int. Cl.⁶ ................................................. B32B 9/00
[52] U.S. Cl. .................. 428/209; 364/488; 364/489; 364/490; 364/491; 228/180.21; 228/180.22
[58] Field of Search ................ 228/180.22, 180.21; 428/209, 488, 489, 490, 491

[56] References Cited

U.S. PATENT DOCUMENTS

| | | | |
|---|---|---|---|
| 3,303,393 | 2/1967 | Hymes et al. | 228/180.22 |
| 3,387,365 | 1/1968 | Stelmark | 228/180.22 |
| 3,403,438 | 10/1968 | Best et al. | 228/180.22 |
| 3,436,818 | 4/1969 | Merrin et al. | 228/180.22 |
| 4,722,060 | 1/1988 | Quinn et al. | 228/180.22 |
| 5,118,584 | 6/1992 | Evans et al. | 430/313 |
| 5,220,200 | 6/1993 | Blanton | 257/778 |
| 5,261,593 | 11/1993 | Casson et al. | 228/180.22 |

Primary Examiner—Patrick J. Ryan
Assistant Examiner—Kam F. Lee
Attorney, Agent, or Firm—Jimmy L. Funke

[57] ABSTRACT

A flip chip integrated circuit device (110) is provided having a surface, a perimeter, and solder bumps (112) located on the surface. At least one solder bump (112), and preferably a plurality of solder bumps (112), are spaced apart from the perimeter of the device (110). Electrically conductive runners (118) extend from the perimeter of the device (110) to each of those solder bumps (112) that are spaced apart from the perimeter, so as to electrically interconnect the solder bumps (112) to a point, such as a pad (116), at the perimeter. As a result, not all of the solder bumps (112) employed by the device (110) need be accommodated at the perimeter of the device (110), such that the size and number of the solder bumps (112) does not dictate the size of the device (110).

8 Claims, 2 Drawing Sheets

SOLDERABLE CONTACTS FOR FLIP CHIP INTEGRATED CIRCUIT DEVICES

The present invention generally relates to solderable contacts for flip chip integrated circuit devices.

BACKGROUND OF THE INVENTION

A flip chip is generally a monolithic semiconductor device, such as an integrated circuit, having bead-like terminals formed on one surface of the chip. The terminals, also referred to as solder bumps, serve to both secure the chip to a circuit board and electrically interconnect the flip chip's circuitry to a conductor pattern formed on the circuit board, which may be a ceramic substrate, printed wiring board, flexible circuit, or a silicon substrate.

A prior art flip chip 10 and its terminal pattern are shown in FIG. 1. Due to the numerous functions typically performed by the microcircuitry of a flip chip 10, a relatively large number of solder bumps 12 are required. As shown in FIG. 2, each solder bump 12 is located at the perimeter of the flip chip 10 on an electrically conductive pad 16 that is electrically interconnected with the circuitry on the flip chip 10. Due to the manner in which the solder bumps 12 are formed, the solder bumps 12 are significantly wider than their pads 16, as can be seen in FIG. 2. The size of a typical flip chip 10 is generally on the order of a few millimeters per side, resulting in the solder bumps 12 being crowded along the perimeter of the flip chip 10. As a result, flip chip conductor patterns (not shown) are typically composed of numerous individual conductors, often spaced on the order of about 0.2 millimeter apart.

Because of the narrow spacing required for the solder bumps and conductors, soldering a flip chip to its conductor pattern requires a significant degree of precision. Reflow solder techniques are widely utilized in the soldering of flip chips. Such techniques typically involve forming solder bumps on the surface of the flip chip using methods such as electrodeposition, by which a quantity of solder can be accurately deposited. Heating the solder above its melting temperature serves to form the characteristic solder bumps. The chip is then soldered to the conductor pattern by registering the solder bumps with their respective conductors and reheating, or reflowing, the solder so as to metallurgically bond the chip to the conductor pattern, and thereby electrically interconnect each of the solder bumps with its corresponding conductor.

Deposition and reflow of the solder must be precisely controlled not only to coincide with the spacing of the terminals and the size of the conductors, but also to control the height of the solder bumps after soldering. As is well known in the art, controlling the height of solder bumps after reflow is necessary in order to prevent the surface tension of the molten solder bumps from drawing the flip chip excessively close to the substrate during the reflow operation. Sufficient spacing between the chip and its substrate is necessary for enabling stress relief during thermal cycles, allowing penetration of cleaning solutions for removing undesirable residues, and enabling the penetration of mechanical bonding and encapsulation materials between the chip and the substrate.

Solder bump height is generally controlled by limiting the amount of solder deposited to form the solder bump 12 and/or by limiting the surface area over which the solder bump 12 is allowed to reflow. As illustrated in FIG. 2, one such approach involves the use of a solderable contact 14 bonded to the pad 16 located at the flip chip's perimeter. The contact 14 contacts the pad 16 through an opening 20 formed in a passivation layer 22 that is conventionally provided on the flip chip's substrate 24. The pad 16 is typically composed of aluminum while the solder bump 12 is generally composed of a tin-lead alloy. Therefore, to promote adhesion between the solder bump 12 and the pad 16, the contact 14 is typically composed of three metal layers: aluminum, nickel/vanadium, and copper. The contact 14 is disc-shaped with a raised perimeter that restricts the lateral flow of the molten solder used to form the solder bump 12. As a result, the overall shape of the solder bump 12 is determined by the size of the contact 14.

While solderable contacts of the type shown in FIG. 2 are widely used in the prior art, the minimum spacing of such contacts is dictated by the required size of the solder bumps and the type of solder deposition process employed. This spacing requirement imposes a minimum limit on the size of the flip chip die, regardless of the die area required for its circuitry. The spacing requirement can also preclude the conversion of an existing die configured for fine pitch wire bonding to a solder bump flip chip of the type shown in FIG. 1.

Alternative approaches to the use of a solderable contact include the use of a solder stop, such as a solder mask or a printed dielectric mask, which covers or alters the conductor in the bump reflow region in order to limit the area over which a solder bump can reflow. However, certain shortcomings exist with this approach that are related to processing costs and accuracy. For example, printed and photoimaged dielectric masks do not provide adequate positional accuracy for certain flip chips, particularly flip chips with fine pitch solder bumps. Furthermore, the cost of obtaining the required accuracy may be prohibitive.

Accordingly, it would be desirable if a solder bump terminal pattern could be employed that did not dictate the size of a flip chip, yet employed solderable contacts that advantageously function to limit the flow of the molten solder bumps during reflow.

SUMMARY OF THE INVENTION

It is an object of this invention to provide a solder bump terminal pattern for a flip chip, wherein the solder bump terminal pattern is configured to achieve a reduced spacing between pads disposed at the perimeter of the flip chip.

The present invention preferably provides a solder bump terminal pattern that employs conductive runners which permit solder bumps to be located a distance from their respective pads and the perimeter of the flip chip, such that the spacing between pads is not dictated by the size of the solder bumps. Instead, the spacing between pads along the perimeter of the flip chip is determined solely by the precision with which the pads are formed. This terminal pattern and the conductive runners are preferably formed by a process that can be performed without an additional deposition and etch step.

According to the present invention, there is provided a flip chip integrated circuit device having a surface, a perimeter, and solder bumps located on the surface. At least one solder bump, and preferably a plurality of solder bumps, are spaced apart from the perimeter of the flip chip integrated circuit device. Electrically conductive runners extend from the perimeter of the device to each of those solder bumps that are spaced apart from the perimeter, so as to electrically interconnect the solder bumps to a point, such as a pad, at the perimeter. As a result, not all of the solder bumps employed by the device need be accommodated at the perimeter of the device, such that the size of the solder bumps need not dictate the size of the device.

The solder bumps and runners can be formed after the device has completed all processing necessary to form either a wirebond or flip chip integrated circuit. Formation of the runners can generally be accomplished by including a photomask step to the processing that forms the solderable contact, and without the requirement for an additional deposition and etching step.

In view of the above, it can be seen that a significant advantage of this invention is that the size of a die for a flip chip is more directly determined by the circuitry on the device, and less so on the number of solder bumps required to electrically interconnect the circuitry with a conductor pattern on the substrate to which the device is to be mounted. Accordingly, the present invention enables a smaller flip chip die to be used for a given circuitry than would be possible with a prior art flip chip.

As is conventional, the solder bump pattern on the flip chip must correspond to a conductor pattern on the surface to which the flip chip is to be mounted. Accordingly, the conductor pattern must be appropriately routed to register with the placement of solder bumps configured in accordance with this invention. Otherwise, this invention is compatible with prior art flip chip processing techniques.

Other objects and advantages of this invention will be better appreciated from the following detailed description.

BRIEF DESCRIPTION OF THE DRAWINGS

The present invention will now be described, by way of example, with reference to the accompanying drawings, in which.

DETAILED DESCRIPTION OF THE INVENTION

Figure 3:
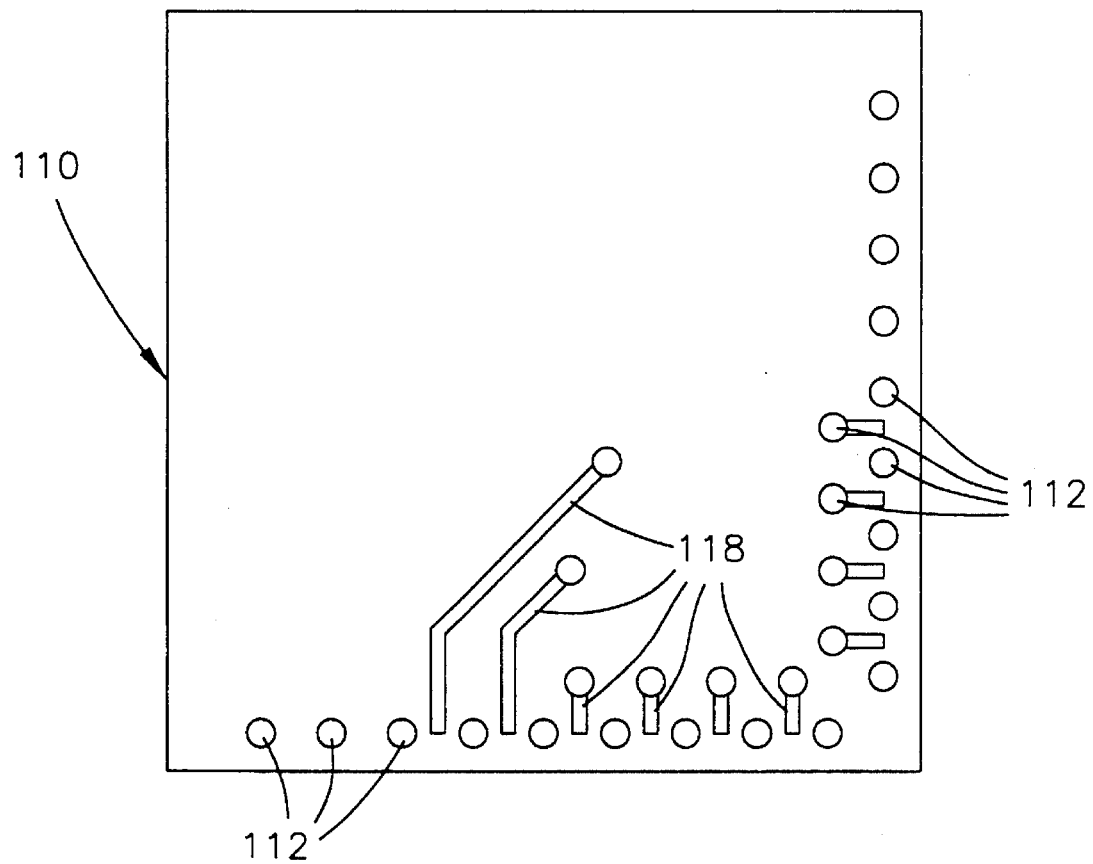
FIGS. 3 and 4 are plan and cross-sectional views, respectively, of the lower surface of a flip chip equipped with a solderable contact configured in accordance with this invention.
Figure 4:
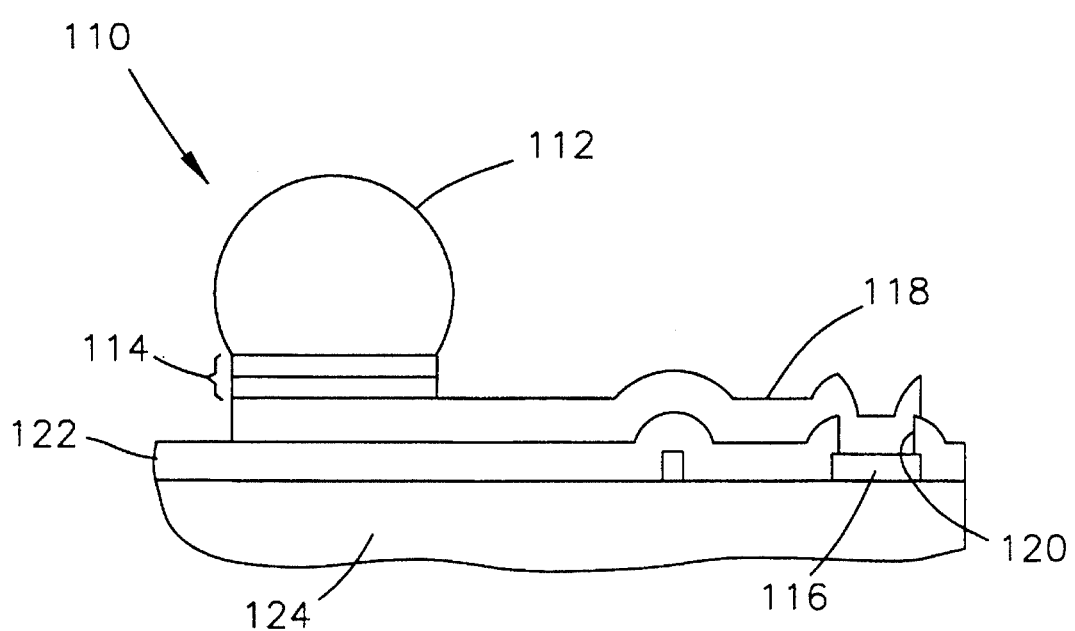

With reference to FIGS. 3 and 4, there is illustrated the lower surface of a flip chip integrated circuit device 110 configured in accordance with this invention. As shown, the surface of the device 110 is provided with a terminal pattern composed of a number of terminals, or solder bumps 112. While some of the solder bumps 112 are shown as being conventionally located at the perimeter of the device 110, others are located within the interior surface region of the device 110, i.e., spaced apart from the perimeter of the device 110. While, as illustrated, every other solder bump 112 is located within the interior of the device 110, this arrangement is not necessary, and various other patterns could be employed.

According to the present invention, electrically conductive runners 118 serve to electrically interconnect the solder bumps 112 located apart from the perimeter of the device 110 with their corresponding electrical contacts located at the perimeter of the device 110. As shown in FIG. 3, the runners 118 are routed from the solder bumps 112 to the perimeter of the device 110, where the runners 118 electrically contact pads 116 that are electrically interconnected with the circuitry on the device 110. Within the constraints of single level metal topology, a pad 116 at any location at the perimeter of the device 110 can be connected to a solder bump 112 at any location on the device 110.

An important feature of this invention is that, because adjacent pads 116 are not required to be spaced sufficiently apart to accommodate solder bumps 116 on each of their respective surfaces, the spacing between pads 116 along the perimeter of the device 110 can be significantly reduced. Consequently, a greater number of solder bumps 112 can be accommodated on a device 110 having a given die size than was possible with the prior art. Alternatively, a smaller die can be employed for a device 110 requiring a given number of solder bumps 116.

Though the distribution of the solder bumps 112 on the surface of the device 110 differs from that of the prior art, the function and formation of the solder bumps 112 need not differ from that of the prior art. The solder bumps 112, which serve as input/output terminals for the device 110, can be formed by conventional techniques, then later reflowed to both bond the device 110 to a circuit board and provide the necessary electrical connection between the device 110 and circuitry on the circuit board.

A preferred embodiment of this invention is described below with reference to FIG. 4, which illustrates in cross-section a portion of the flip chip integrated circuit device 110 of FIG. 3. As is conventional, the device 110 is formed from a die represented as a substrate 124. The substrate 124 is a semiconductor material, as is conventional. As a flip chip, the device 110 is a monolithic semiconductor device widely utilized in the industry, and is configured to be bonded to a surface using a flip-chip bonding process. Flip-chip bonding alleviates the use of a separate integrated circuit package with discrete leads. Instead, the solder bumps 112 are formed as bead-like projections on a surface of the device 110 to serve as terminals that electrically interconnect the device 110 to a conductor pattern formed on the surface of a circuit board to which the device 110 is to be mounted.

As is also conventional, a passivation layer 122, such as silicon dioxide, is formed on the surface of the substrate 124. Prior to forming the passivation layer 122, the electrically conductive pads 116 are formed along the perimeter of the device 110. The number of pads 116 formed will typically correspond to the number of solder bumps 112 required by the device 110. The solder bumps 112 shown in FIG. 3 as being disposed along the perimeter of the device 110 can generally have the appearance of the prior art configuration shown in FIG. 2. However, those solder bumps 112 located within the interior surface region of the device 110, i.e., spaced apart from the perimeter of the device 110, are electrically interconnected to their respective pads 116 with an electrically conductive runner 118, as shown in FIGS. 3 and 4. An access 120 to the pads 116 can be achieved conventionally by selectively etching the passivation layer 122 from the pads 116. Thereafter, the runners 118 can be formed using a masking step to selectively deposit aluminum or another suitable metal.

The runners 118 are formed such that their inward ends terminate where it is desired that a solder bump 112 be formed. A solderable contact 114 is then formed at the inward end of the runner 118 to electrically and physically interconnect each runner 118 to its corresponding solder bump 112. For this purpose, the solderable contact 114 is preferably composed of a copper layer that will readily bond to the solder bump 112 and a nickel layer that will readily bond to the aluminum runner 118 and the copper layer. The nickel layer also serves to prevent the copper layer from diffusing into the aluminum runner 118. The contact 114 is not required to have a raised perimeter, in that the molten solder used to form the solder bump 112 will naturally coalesce to form a droplet whose lateral flow is limited by the surface area of the contact 114. The surface tension of the molten solder bump 112 will prevent the molten solder from flowing off the contact 114, thus constraining the solder bump 112 to assume a shape that is dictated by the amount of solder initially deposited on the contact 114 and the size of its contact 114, each of which can be readily and accurately controlled with equipment presently used for solder deposition, circuit board and thick film processes.

Figure 1:
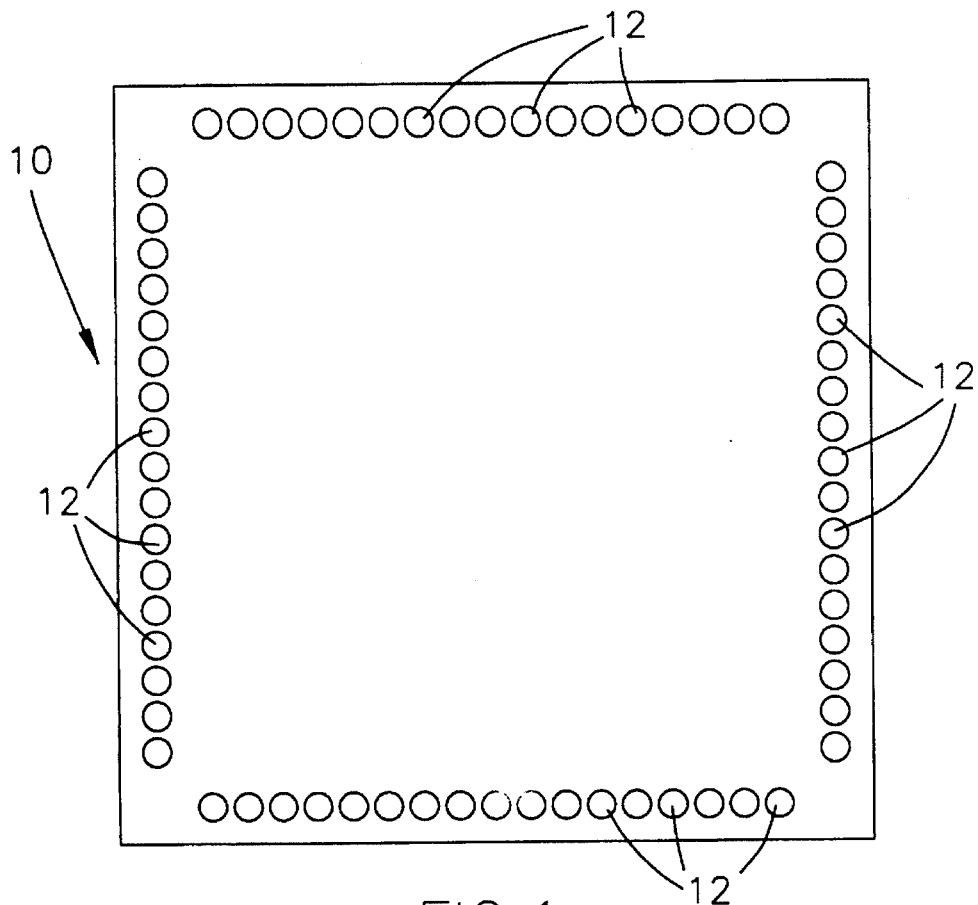
FIGS. 1 and 2 are plan and cross-sectional views, respectively, of the lower surface of a flip chip equipped with a solderable contact configured in accordance with the prior art.
Figure 2:
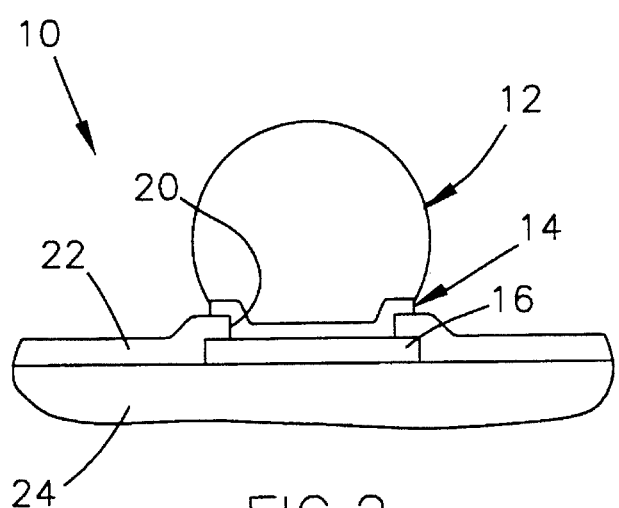

The solder bumps 112 can be screen printed or electrodeposited on the contacts 114 simultaneously with those solder bumps 112 that are deposited on the conventional pads located at the perimeter of the device 110, as shown in FIG. 2. Suitable solder alloys include, but are not limited to, tin-lead alloys containing about 10 to about 60 percent tin, indium-lead alloys containing about 10 to about 60 percent indium, and indium-lead-silver alloys containing about 10 to about 60 percent indium and up to about 5 percent silver. The solder bumps 112 are accurately located on the device 110 such that, when the device 110 is registered with a corresponding conductor pattern, each of the solder bumps 112 will be accurately and uniquely mated with a corresponding conductor, as is conventional. In turn, the conductors must be uniquely patterned to correspond with the location of the solder bumps 112 on the device 110. A metallurgical bond can be achieved between the solder bumps 112 and their respective conductors using a solder reflow technique, in which the solder bumps 112 are melted in order to form a corresponding number of solder joints between the device 110 and the conductors. Reflow can be achieved by any of a number of techniques well known in the art, and therefore will not be discussed in detail here.

From the above, it can be seen that a significant advantage of this invention is that the size of a die for a flip chip integrated circuit device is more directly influenced by the circuitry on the device, and less so on the number of solder bumps required to electrically interconnect the circuitry with the conductor pattern on the substrate to which the device is to be mounted. Accordingly, in comparison to a prior art flip chip, it is foreseeable that a smaller flip chip die can be employed for identical circuitry. As is conventional, the solder bump pattern on the flip chip must correspond to a conductor pattern on the circuit board to which the flip chip is to be mounted, necessitating that the conductor pattern be adapted to register with the placement of the solder bumps formed in accordance with this invention. Otherwise, this invention is compatible with prior art flip chip processing techniques.

In addition, this invention enables each of the solder bumps to be formed using known deposition techniques, such as screen printing or electrodeposition methods. Furthermore, the runners can be formed from the same material as the pads by employing one additional masking step, such that the present invention is not complicated by excessive processing steps requiring significant amounts of time or equipment, apart from that conventionally required for flip-chip processing and bonding techniques.

While our invention has been described in terms of a preferred embodiment, it is apparent that other forms could be adopted by one skilled in the art for example, by modifying the runner and solder bump pattern illustrated, or by substituting appropriate materials. Accordingly, the scope of our invention is to be limited only by the following claims.

What is claimed is:

1. A flip chip integrated circuit device having a surface, a perimeter, and solder bumps located on the surface, the flip chip integrated circuit device comprising:

at least one solder bump of the solder bumps being spaced apart from the perimeter of the flip chip integrated circuit device;

a second solder bump of the solder bumps being disposed at the perimeter of the flip chip integrated circuit device: and a runner extending from the at least one solder bump to the perimeter of the flip chip integrated circuit device so as to electrically interconnect the at least one solder bump to a point at the perimeter.

2. A flip chip integrated circuit device as recited in claim 1 further comprising a solderable contact between the at least one solder bump and the runner.

3. A flip chip integrated circuit device as recited in claim 2 wherein the solderable contact comprises a nickel layer in contact with the runner and a copper layer between the nickel layer and the at least one solder bump so as to form an electrically conductive path between the runner and the at least one solder bump.

4. A flip chip integrated circuit device as recited in claim 1 wherein the point at the perimeter of the flip chip integrated circuit device comprises an electrically conductive pad.

5. A flip chip integrated circuit device having a surface, a perimeter, pads aligned adjacent the perimeter, and solder bumps located on the surface, the flip chip integrated circuit device comprising:

at least one solder bump of the solder bumps being spaced apart from the perimeter;

a second solder bump of the solder bumps being disposed at the perimeter;

a runner extending from the at least one solder bump to a corresponding one of the pads so as to electrically interconnect the at least one solder bump with the corresponding one of the pads, wherein all of the solder bumps located on the surface of the flip chip integrated circuit device are in electrical communication with the pads at the perimeter; and a solderable contact between the at least one solder bump and the runner.

6. A flip chip integrated circuit device as recited in claim 5 wherein the solderable contact comprises a nickel layer in contact with the runner and a copper layer between the nickel layer and the at least one solder bump so as to form an electrically conductive path between the runner and the at least one solder bump.

7. A flip chip integrated circuit device as recited in claim 5 wherein a first plurality of the solder bumps are spaced apart from the perimeter and a second plurality of the solder bumps are disposed at the perimeter, and wherein electrically conductive runners electrically interconnect each of the first plurality of the solder bumps with a corresponding one of the pads and each of the second plurality of the solder bumps is supported by one of the pads not electrically interconnected with the first plurality of the solder bumps.

8. A flip chip integrated circuit device as recited in claim 5 wherein a first plurality of the solder bumps are spaced apart from the perimeter and a second plurality of the solder bumps are disposed at the perimeter, and wherein electrically conductive runners electrically interconnect the first plurality of the solder bumps with every other pad along the perimeter of the flip chip integrated circuit device and each of the second plurality of the solder pumps is supported by one of the pads not electrically interconnected with the first plurality of the solder bumps.

* * * * *